(12) United States Patent
Mitrovic et al.

(10) Patent No.: US 8,980,000 B2
(45) Date of Patent: Mar. 17, 2015

(54) DENSITY-MATCHING ALKYL PUSH FLOW FOR VERTICAL FLOW ROTATING DISK REACTORS

(75) Inventors: Bojan Mitrovic, Middlesex, NJ (US); Alex Gurary, Bridgewater, NJ (US); William Quinn, Whitehouse Station, NJ (US); Eric A. Armour, Pennington, NJ (US)

(73) Assignee: Veeco Instruments Inc., Plainview, NY (US)

( * ) Notice: Subject to any disclaimer, the term of this patent is extended or adjusted under 35 U.S.C. 154(b) by 1053 days.

(21) Appl. No.: 11/544,075

(22) Filed: Oct. 6, 2006

(65) Prior Publication Data

US 2007/0134419 A1     Jun. 14, 2007

Related U.S. Application Data

(63) Continuation-in-part of application No. 10/568,794, filed as application No. PCT/US03/26112 on Aug. 20, 2003, now abandoned.

(51) Int. Cl.
    *C30B 25/14*       (2006.01)
    *C30B 25/16*       (2006.01)
    *C23C 16/455*     (2006.01)

(52) U.S. Cl.
    CPC ..... *C23C 16/45563* (2013.01); *C23C 16/45574* (2013.01); *C23C 16/45578* (2013.01); *C30B 25/165* (2013.01)
    USPC .................... 117/85; 117/84; 117/88; 117/98; 117/99; 117/107

(58) Field of Classification Search
    USPC .............................. 117/84, 88, 98, 99, 107, 85
    See application file for complete search history.

(56) References Cited

U.S. PATENT DOCUMENTS 4,010,045 A * 3/1977 Ruehrwein ................... 117/102

4,369,031 A     1/1983   Goldman et al.
(Continued)

FOREIGN PATENT DOCUMENTS

EP         0339845 B1     1/1993
JP         1-047017 A      2/1989
(Continued)

OTHER PUBLICATIONS

Office Action from corresponding Japanese Application 2005-508277, Jun. 19, 2009.
(Continued)

*Primary Examiner* — Matthew Song
(74) *Attorney, Agent, or Firm* — Lerner, David, Littenberg, Krumholz & Mentlik, LLP

(57) ABSTRACT

In a rotating disk reactor for growing epitaxial layers on substrate or other CVD reactor system, gas directed toward the substrates at gas inlets at different radial distances from the axis of rotation of the disk has both substantially the same gas flow rate/velocity and substantially the same gas density at each inlet. The gas directed toward portions of the disk remote from the axis may include a higher concentration of a reactant gas than the gas directed toward portions of the disk close to the axis, so that portions of the substrate surfaces at different distances from the axis receive substantially the same amount of reactant gas per unit area, and a combination of carrier gases with different relative molecular weights at different radial distances from the axis of rotation are employed to substantially make equal the gas density in each region of the reactor. The system may be applied with a combination or carrier gases at multiple gas inlets, a combination of carrier and reactant gases at multiple inlets, and may be used with an arbitrarily large number of gases, when at least two gases of different molecular weights are provided. A linear flow pattern is achieved within the reactor, avoiding laminar recirculation areas, and permitting uniform deposition and growth of epitaxial layers on the substrate.

22 Claims, 7 Drawing Sheets

(56) References Cited

U.S. PATENT DOCUMENTS

| | | | |
|---|---|---|---|
| 4,741,354 A | | 5/1988 | DeMild, Jr. |
| 4,980,204 A | * | 12/1990 | Fujii et al. ............... 117/98 |
| 4,993,358 A | * | 2/1991 | Mahawili ............... 118/715 |
| 5,091,320 A | | 2/1992 | Aspnes et al. |
| 5,106,453 A | | 4/1992 | Benko et al. |
| 5,269,847 A | | 12/1993 | Anderson |
| 5,393,232 A | | 2/1995 | Haines |
| 5,431,738 A | | 7/1995 | Murakami et al. |
| 5,843,234 A | | 12/1998 | Finn et al. |
| 5,853,484 A | | 12/1998 | Jeong |
| 5,956,148 A | * | 9/1999 | Celii ............... 356/369 |
| 5,976,261 A | * | 11/1999 | Moslehi et al. ............... 118/719 |
| 6,090,458 A | | 7/2000 | Murakami |
| 6,197,121 B1 | * | 3/2001 | Gurary et al. ............... 118/725 |
| 6,280,581 B1 | | 8/2001 | Cheng |
| 6,289,842 B1 | * | 9/2001 | Tompa ............... 118/723 E |
| 6,333,272 B1 | | 12/2001 | McMillin et al. |
| 6,428,850 B1 | | 8/2002 | Shinriki et al. |
| 6,448,536 B2 | * | 9/2002 | Li et al. ............... 219/390 |
| 6,480,286 B1 | | 11/2002 | Kubo et al. |
| 6,499,425 B1 | | 12/2002 | Sandhu et al. |
| 6,511,539 B1 | | 1/2003 | Raaijmakers |
| 6,534,332 B2 | * | 3/2003 | Bourret-Courchesne ....... 438/47 |
| 6,887,523 B2 | * | 5/2005 | Zhuang et al. ............ 427/255.31 |
| 7,524,532 B2 | * | 4/2009 | Jurgensen et al. ......... 427/248.1 |
| 2002/0009868 A1 | * | 1/2002 | Tobashi et al. ............... 438/610 |
| 2002/0076490 A1 | | 6/2002 | Chiang et al. |
| 2002/0185068 A1 | * | 12/2002 | Gurary et al. ............... 118/722 |
| 2003/0056728 A1 | | 3/2003 | Lindner et al. |
| 2003/0091740 A1 | * | 5/2003 | Gilbert et al. ............. 427/255.28 |
| 2003/0207032 A1 | | 11/2003 | Ahn et al. |
| 2006/0021574 A1 | * | 2/2006 | Armour et al. ............... 118/715 |
| 2006/0121193 A1 | * | 6/2006 | Strauch et al. ............. 427/248.1 |
| 2007/0071896 A1 | | 3/2007 | Murphy et al. |
| 2009/0017190 A1 | | 1/2009 | Sferlazzo et al. |
| 2009/0064932 A1 | | 3/2009 | Kim et al. |
| 2009/0236447 A1 | | 9/2009 | Panagopoulos et al. |
| 2010/0012034 A1 | * | 1/2010 | Strauch et al. ............. 118/723 R |
| 2012/0156363 A1 | | 6/2012 | Quinn et al. |

FOREIGN PATENT DOCUMENTS

| | | |
|---|---|---|
| JP | 01-140712 A | 6/1989 |
| JP | 2-096324 A | 4/1990 |
| JP | H02187018 A | 7/1990 |
| JP | H03262116 A | 11/1991 |
| JP | 4-364024 A | 12/1992 |
| JP | 05-335239 | 12/1993 |
| JP | 2000-091320 A | 3/2000 |
| JP | 2000286251 A | 10/2000 |
| JP | 2001-351864 A | 12/2001 |
| JP | 2002-155366 A | 5/2002 |
| KR | 10-0158780 | 11/1998 |
| KR | 2000-0069146 | 11/2000 |
| KR | 2002-0084102 | 11/2002 |
| KR | 10-2006-0079187 | 7/2006 |
| TW | I261310 B | 9/2006 |
| WO | 9823788 | 6/1998 |
| WO | 2005019496 | 3/2005 |
| WO | 2006020424 A2 | 2/2006 |

OTHER PUBLICATIONS

Search Report from Taiwanese Application No. 096136935, dated Aug. 12, 2011.

Brieland et al., "Design and Verification of Nearly Ideal Flow and Heat Transfer in a Rotating Disk Chemical Vapor Deposition Reactor," J. Electrochem. Soc., vol. 138, No. 5, Jun. 1991, pp. 1806-1816.

Korean Office Action for Application No. 10-2009-7009061 dated Dec. 23, 2013.

Korean Office Action for Application No. 10-2009-7009061 dated May 1, 2013.

Japanese Office Action for Application No. 2010-153158 dated Apr. 19, 2013.

Translation of Decision from Taiwanese Application No. 096136935 dated Apr. 23, 2012 citing Citation 1 (TW 200511394), which corresponds to TW 1261310 and US 20070071896.

Translation of Office Action from Taiwanese Application No. 096136935 dated Aug. 10, 2011, citing TW 200511394, which corresponds to TW 1261310 and US 20070071896.

Korean Office Action for Application No. 10-2014-7010398 dated Jul. 9, 2014.

Non-Final Office Action issed May 6, 2014 in connection with U.S. Appl. No. 12/972,270, filed Dec. 17, 2010, 13 pgs.

* cited by examiner

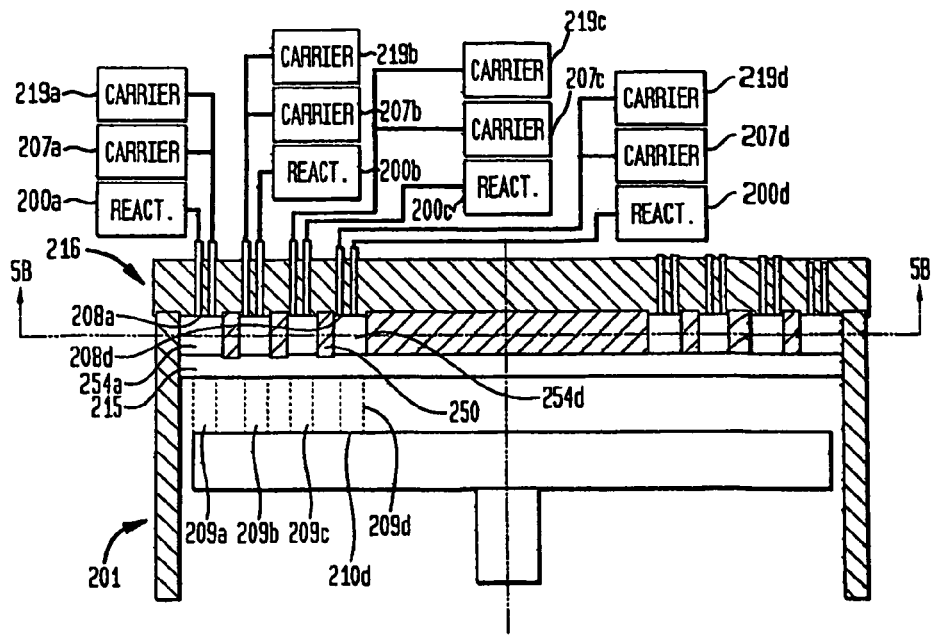
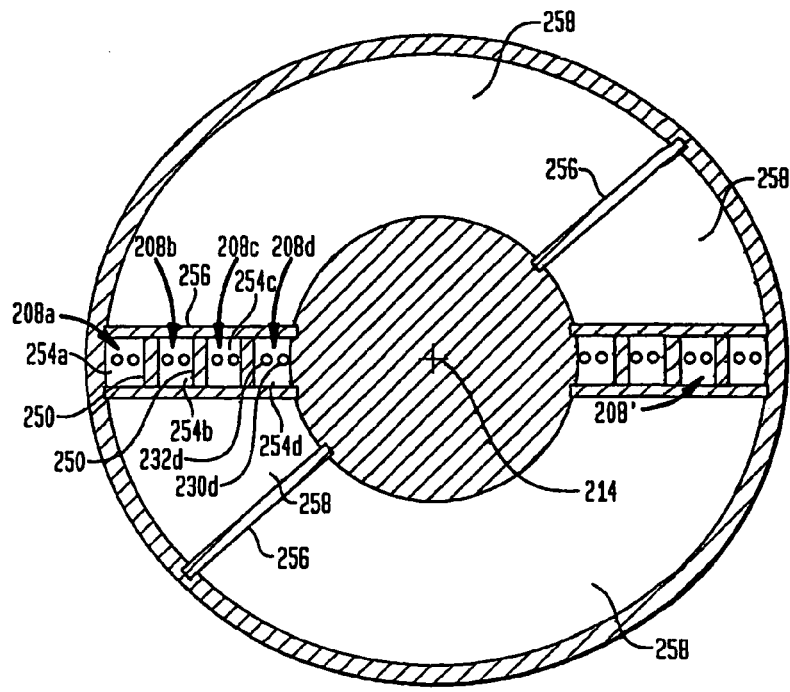

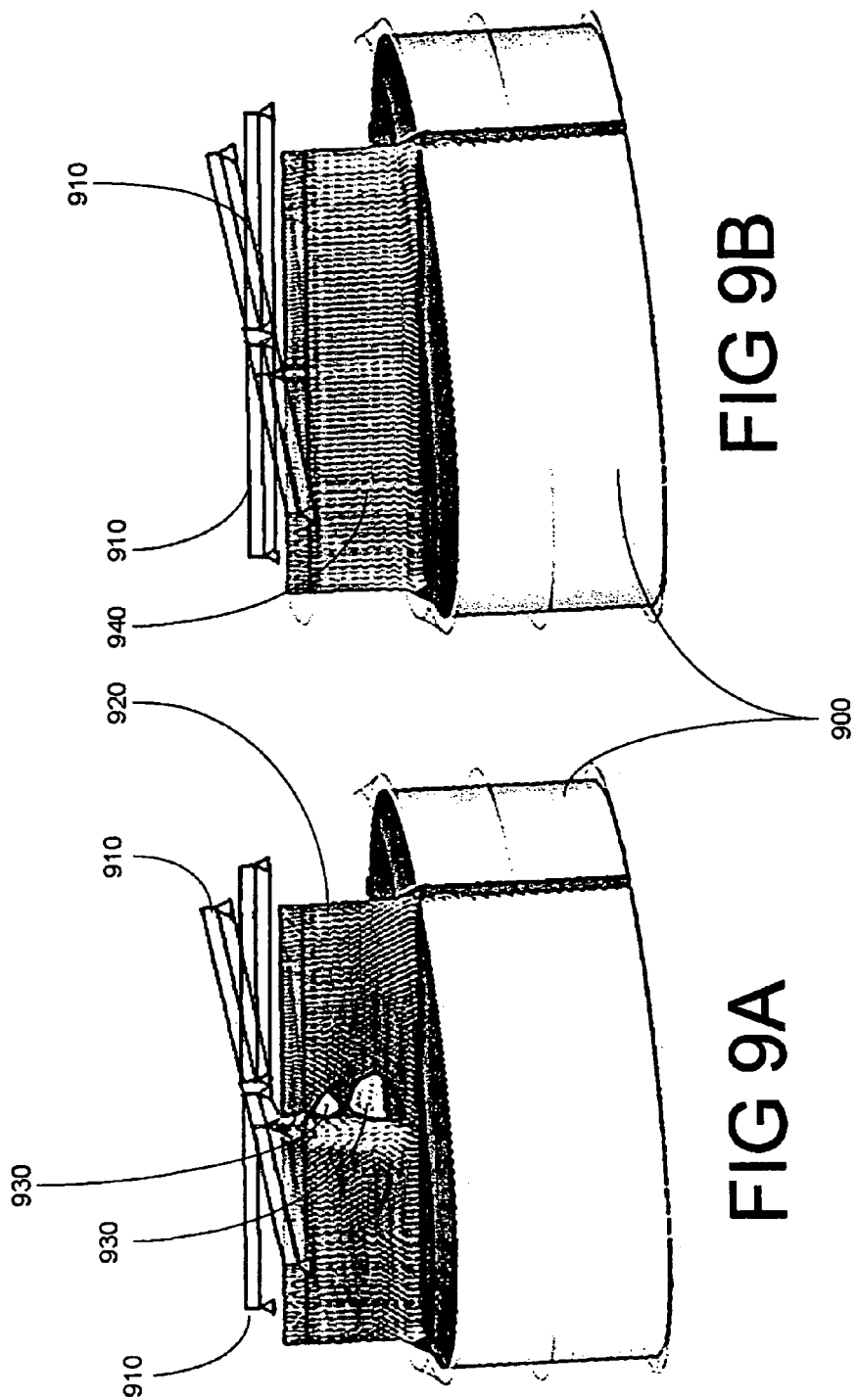

US 8,980,000 B2

DENSITY-MATCHING ALKYL PUSH FLOW FOR VERTICAL FLOW ROTATING DISK REACTORS

CROSS-REFERENCE TO RELATED APPLICATIONS

This application is a continuation-in-part of U.S. application Ser. No. 10/568,794, filed on Feb. 17, 2006, now abandoned, the disclosure of which is incorporated herein by reference, which is a national phase entry under 35 U.S.C. §371 of International Application No. PCT/US2003/026112 filed Aug. 20, 2003, published in the United States and internationally, which is incorporated herein by reference.

TECHNICAL FIELD OF THE INVENTION

The present invention relates to metal organic chemical vapor phase deposition reactors. More particularly, the present invention relates to rotating disk reactors in which one or more gases are injected onto the surface of a rotating substrate to grow epitaxial layers thereon.

BACKGROUND OF THE INVENTION

Vertical high-speed rotating disk reactors, in which the gas or gases are injected downwardly onto a substrate surface rotating within a reactor, are frequently employed for metal organic chemical vapor deposition (MOCVD). Vertical disk-type CVD reactors, in particular, have been found useful for wide varieties of epitaxial compounds, including various combinations of semiconductor single films and multilayered structures such as lasers and LED'S. In these reactors, one or more injectors spaced above a substrate carrier provide a predetermined gas flow, which upon contact with the substrate, deposits layers of epitaxial material on the surface of the substrate.

For larger wafers, rotating disk reactors employ several injectors spaced above the substrate. The injectors are typically spaced above the wafer in various positions along one or more radial axes of the wafer, relative to the central axis of the substrate carrier. Frequently, the rate of source reactant material injected into the reactor varies from injector to injector to permit the same molar quantity of reactant to reach the surface of the substrate. Hence, some reactant injectors may have different gas velocities than others. This variation in reactant flow rate/velocity is, in pertinent part, due to the relative placement of the injectors. As the reactor carrier holding the substrate rotates at a predetermined rate, the injectors near the outer edge of the carrier cover a larger region of surface area on the carrier than the injectors closer to the center of the carrier in any given time period. Thus, the outer injectors typically employ a greater gas flow rate/velocity of reactant than the inner injectors in order to maintain desired uniformity. For example, individual injector gas velocities may differ by a factor of as much as three to four between adjacent injectors.

While this variation in gas flow rate/velocity helps to ensure a more uniform layer thickness, it may also cause turbulence between the injector flows due to their varying velocities. Also, the risk of side effects such as uneven layer thickness, dissipation of reactant, or premature condensation of reactant may be increased.

In Patent Cooperation Treaty Application No. WO/2005/019496A1 and corresponding U.S. patent application Ser. No. 10/568,794 entitled "ALKYL PUSH FLOW FOR VERTICAL FLOW ROTATING DISK REACTORS", assigned to the assignee of the present application and incorporated herein by reference, one solution to this problem is discussed in which flow rate/velocity of total gas flow is matched in all regions of a reactor while providing substantially equal reactant gas to each region by combining reactant gas flow and a carrier gas flow in each region to match total gas flow rate in each region. This technique improves the uniformity of deposition of reactant on a substrate at which the gas flow is directed, but there is further room for improvement in uniformity of reactant deposition.

DISCLOSURE OF THE INVENTION

It has been discovered that increased uniformity in the total gas density substantially increases the uniformity of deposition and reduces turbulence and vortices in fluid gas flow within the CVD reaction chamber.

One aspect of the invention provides a chemical vapor deposition reactor with total gas flow rate/velocity and total gas density substantially matched in the chemical vapor deposition reaction chamber, hence improving uniformity and further reducing non-laminar gas recirculation vortices and turbulence. In one aspect, the system includes a chamber and a substrate carrier mounted for movement within the chamber, most preferably for rotational movement about an axis. The substrate carrier is adapted to hold one or more substrates, most preferably so that surfaces of the substrates to be treated lie substantially perpendicular to the axis. The reactor according to this aspect of the invention desirably includes a gas stream generator arranged to deliver one or more gas streams within the chamber directed toward the substrate carrier at a substantially uniform flow rate. The reactor is advantageously designed such that the chamber holding the substrate carrier therein is maintained at a known, substantially predetermined temperature and pressure.

The gas stream generator most preferably is arranged so that each gas stream includes at least one, and preferably a plurality, of carrier gases of different relative molecular weights, and preferably at least one reactant gas. Where the substrate carrier is mounted for rotational movement about an axis, the gas stream generator desirably is arranged to supply said one or, preferably a plurality, of gas streams with different concentrations of the reactant gas and different relative concentrations of carrier gas(es) at different radial distances from the axis. The gas directed towards a portion of the substrate carrier near the axis desirably includes a relatively large concentration of the set of carrier gases and a relatively small concentration of the reactant gas, whereas the gas directed towards a portion of the substrate carrier desirably includes a high concentration of the reactant gas and a small concentration of the carrier gas(es).

Further, for each gas stream, the total gas density is matched by adjusting the relative concentration of each of the carrier gas(es) of different molecular weights at that gas stream based on the concentration of reactant gas and reactant gas molecular weight previously selected, such that the total molecular weight of the total gas stream at each gas stream is substantially equal. The relative concentration of the plurality of carrier gases of different molecular weight are advantageously adjusted through a device such as an adjustable mass flow regulator.

The gas stream generator may include a plurality of gas inlets communicating with the chamber at different distances from the axis, as well as one or more sources of a reactant gas connected to the inlets and one or more sources of a carrier gas connected to at least one of inlets, as well as one or more mass flow regulators connected to each of sources of reactant gas and each of the sources of carrier gas in order to control the density.

A further aspect of the invention includes methods of treating substrates, including rotating a substrate support in a chamber about an axis while supporting one or more substrates to be treated on the support so that surfaces of the substrates lie substantially perpendicular to said axis. The method further includes introducing a reactant gas and a plurality of carrier gas into the chamber so that said gases flow within said chamber toward the surfaces in one or more streams having substantially uniform flow rate at different radial distances from said axis. The method further includes adjusting the relative concentration of each of the plurality of carrier gases with a known molecular weight at each gas flow location such that (given the reactant gas of a known molecular weight and a known concentration at each gas flow location) the total gas density (in terms of total gas molecular weight per unit volume) is substantially equal at each gas flow location. This is preferably performed at a known temperature and pressure in the chamber, so that the gases flow within the chamber towards the surfaces in one or more streams having substantially uniform reactant gas density at different radial distances from said axis thus minimizing turbulence.

The one or more gas streams are arranged so that different portions of the substrate surfaces at different radial distances from the axis receive substantially the same amount of said reactant gas per unit time per unit area. Most preferably, the step of introducing the carrier gas and reactant gas includes mixing at least some of the reactant gas with the carrier gas so that gas flowing toward radially outward portions of the substrate surfaces has a higher concentration of the reactant gas than gas flowing toward radially inward portions of the surfaces, close to the axis and regulating mass flow of each carrier gas so as to equalize the reactant gas density of each of the resulting gas streams.

Preferred reactors and methods according to the foregoing aspects of the invention can provide uniform distribution of the reactant gas over the treatment surface of a substrate carrier, such as over the surface of a rotating disk substrate carrier, while avoiding turbulence caused by differing reactant gas velocities. In alkyl/hydride deposition systems, for example, the combination of density and flow rate matching provide for better deposition uniformity due to better diffusion of alkyls, resulting in less inconsistent growth rate responses from the individual alkyl injectors. Moreover, boundary layer thickness is more uniform from zone to zone since it is not disturbed with the local changes in densities, given that boundary layer thickness is directly proportional to the density. Additionally, increased boundary layer uniformity also triggers reduced buoyancy-induced recirculation, thus allowing a wider array of processing options in process parameters space.

BRIEF DESCRIPTION OF THE DRAWINGS

FIG. 5A is a fragmentary sectional elevational view depicting a reactor according to yet another embodiment of the invention.

FIG. 5B is a sectional view along line 5B-5B in FIG. 5A.

FIGS. 9a and 9b provide a side view of a reactor according to one embodiment of the present invention including a fluid flow representation of vertical total gas flow flow rate, before density matching in FIG. 9a, and after density matching in FIG. 9b.

MODES FOR CARRYING OUT THE INVENTION

Figure 1A:
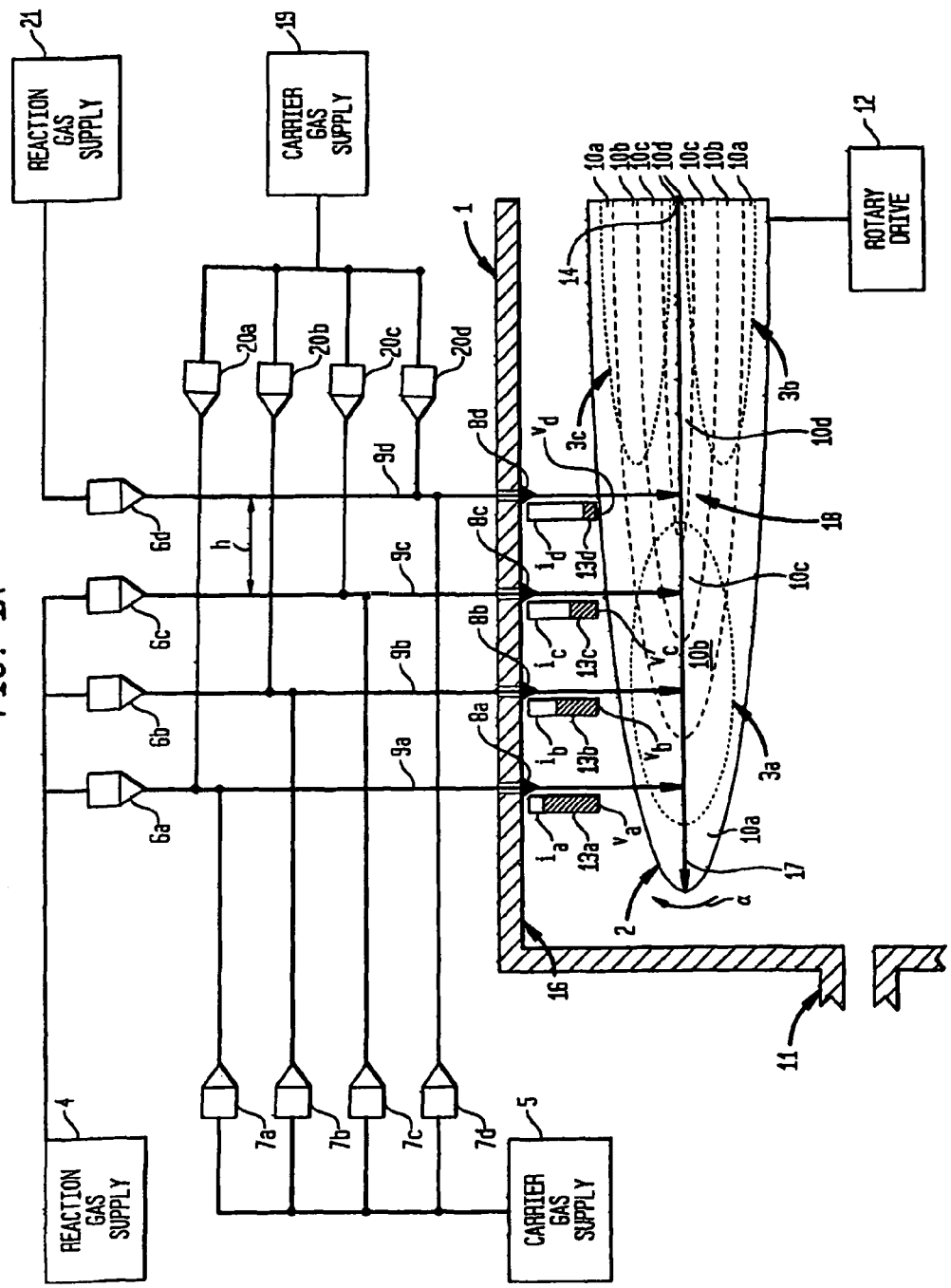
FIG. 1A is a schematic view depicting a reactor according to one embodiment of the present invention.
Figure 1B:
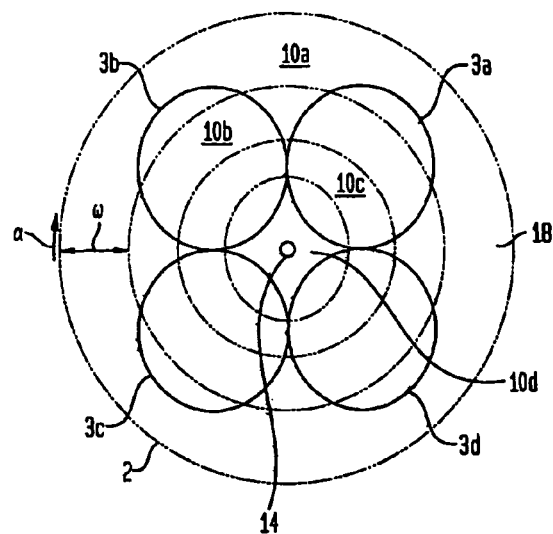
FIG. 1B is a top plan view of a substrate carrier used in the embodiment of FIG. 1A.

An apparatus according to one embodiment of the invention, depicted schematically in FIG. 1, includes a reaction chamber 1 and a substrate carrier 2. The chamber includes a top wall 16 and an exhaust port 11. The substrate carrier 2 is mounted within the chamber 1 for rotation about a central axis 14 and connected to a rotary drive system 12 so that the substrate carrier 2 can be rotated around the axis 14. The substrate carrier 2 defines a treatment surface 18 in the form of a generally planar disc perpendicular to axis 14 and facing toward top wall 16. Only a portion of such surface 18 is depicted in FIG. 1. The reaction chamber 1 is equipped with other conventional elements (not shown) for facilitating the desired epitaxial growth reaction as, for example, a heating system for maintaining the substrate carrier at an elevated temperature, temperature monitoring devices and pressure monitoring devices, such as, for example, a sucspetor for heating the substrate carrier. These features of the apparatus may be of the type used in reactors sold under the trademark TURBODISC® by Veeco Instruments Inc. of Woodbury, N.Y. and formerly sold by Emcore Corporation of Somerset, N.J. The systems and methods described herein can be used with many types of reactors though, including both susceptor and susceptorless reactors, reactors with alternative geometries such as inverted (upside down) or side-gas entry CVD reactors, and for CVD deposition on other materials besides semiconductor substrates such as semiconductor wafers.

The reactor has a plurality of gas stream inlets 8a-8d communicating with the interior of the chamber through top wall 16. In the embodiment of FIG. 1, each inlet is in the form of a single port directed downwardly in a direction parallel to central axis 14 towards the treatment surface 18 of the carrier, and the port of each inlet is of the same size. Gas stream inlets 8a-8d are arranged along a common plane which extends radially from central axis 14. The common plane is a plane defined by axis 14 and a radial line 17 extending perpendicular to axis 14. The gas stream inlets 8a-8d are spaced apart from one another, for example, by a uniform spacing distance h in the radial direction. Each inlet 8 is aligned with a different annular zone of treatment surface 18. Thus, outermost or first inlet 8a is aligned with an outermost zone 10a furthest from axis 14; inlet 8b is aligned with the next zone 10b; inlet 8c is aligned with zone 10c, and inlet 8d is aligned with the innermost zone 10d, closest to axis 14. Although the zone borders are indicated by broken lines in FIG. 1 for clarity of illustration, these zones typically are not delineated by visible features of the substrate carrier.

The reactor includes a plurality of reaction gas sources 6a-6d, each such source being adapted to supply a reaction gas at a predetermined mass flow rate. Any device capable of providing the reaction gas at a predetermined rate may be used, and preferably, an adjustable mass flow regulator is included in order to modify a gas mass flow rate in light of a known temperature and pressure in the reaction chamber. However, other pressure control systems can be used with the present system, such as, for example, fixed orifices, manual pressure controls, or computer-controlled flow systems can be employed. In the arrangement illustrated, each reaction gas source 6a-6c is a flow restricting device, and sources 6a-6c are connected to a common supply 4 of the reaction gas, for example, a tank holding such gas under pressure. More than one reaction gas supply is advantageously used when more than one reactant gas is used in deposition, as shown in, for example, FIG. 5 below. In this example embodiment, a second reaction gas supply 21 holding a second reaction gas is connected to a reaction gas source 6d, which is also a flow restricting device. The flow restricting device incorporated in each gas sources 6a-6d may include any conventional flow control structure such as a fixed orifice, a manually adjustable valve or an automatically-controlled valve linked to a feedback control system (not shown) or a metering pump. Where the reactant gas is formed by vaporization from the liquid phase, each reactant gas source may include a separate evaporator arranged to control the rate of vaporization, or else each gas source may include a flow restricting device as discussed above, all of these being connected to a common evaporator.

The reactant gases may be any gas, vapor, or material desired to be injected into the reactor to participate in the deposition on a substrate within the reactor. More particularly, the reactant gas may be any gas which is suitable for treating the substrate surface. For example, where the desired treatment is growth of a semiconductor layer such as epitaxial growth, the reactant gas includes one or more constituents of the semiconductor to be grown. For example, the reactant gas may include one or more metal alkyls for deposition of a compound semiconductor. The reactant gas may be a mixture of plural chemical species, and may include inert, non-reactive components. Where the desired reaction includes etching of a substrate surface, the reactant gas may include a constituent reactive with the material of the substrate surface.

The types of material systems to which the present invention can be applied can include, for example, epitaxial growth of Group III-V semiconductors such as GaAs, GaP, GaAs1−xPx, Ga1−yAlyAs, Ga1−yInyAs, AlAs, InAs, InP, InGaP, InSb, GaN, InGaN, AlxGa1−xN, In0.5(Ga1−xAlx)0.5P, InxGa1−xAsyP1−y, and the like. However, the invention can also be applied to other systems. These include Group II-VI compounds, such as ZnSe, CdTe, HgCdTe, CdZnTe, CdSeTe, and the like; Group IV-IV compounds, such as SiC, diamond, and SiGe; as well as oxides, such as YBCO, BaTiO, MgO2, ZrO, SiO2, ZnO and ZnSiO; and metals, such as Al, Cu and W. Furthermore, the resultant materials will have a wide range of electronic and opto-electronic applications, including high brightness light emitting diodes (LED's), lasers, solar cells, photocathodes, HEMT's and MESFET's.

In one exemplary embodiment incorporating both gas flow rate/velocity matching and reactant gas density matching described below, TMG (trimethylgallium) and NH3 (ammonia) are employed as reactant gases and are matched for respective uniform total gas flow rate, uniform total gas density, and uniform reactant deposition rate at the wafer carrier through the use of various combinations of nitrogen (N2) and hydrogen (H2) as carrier gases.

First carrier gas sources 7a-7d are also provided. The first carrier gas sources 7a-7d may be similar in structure to the reaction gas sources (including an adjustable mass flow regulator), and may be connected to a common supply 5 of a carrier gas. Additionally, preferably second carrier gas sources 20a-20d are provided, similar in structure to the reaction gas sources (including an adjustable gas flow regulator), and may be connected to a common supply 19 of a second carrier gas. Preferably, each of the carrier gases 5 and 20 are of different molecular weights. Advantageously, additional carrier gases can be added as well through the use of additional gas sources and gas supplies. Each gas stream inlet 8a-8d is connected to one reaction gas source 6a-6d and to the carrier gas sources 7a-7d and 20a-20d respectively. For example, inlet 8a is connected to reaction gas source 6a, carrier gas source 7a and carrier gas source 20a, whereas inlet 8d is connected to reaction gas source 6d, carrier gas source 7d, and carrier gas source 20d.

The carrier gas may be any carrier desired which does not participate in the deposition reaction in the chamber given the reactant gases to be applied to the substrate, such as an inert gas or a non-participating gas in the reaction, or, alternatively the carrier gas may be, for example, itself a reactant gas which serves as a non rate limiting participant in a reaction and thus may be provided in any desired quantity so long as such quantity is in excess of a rate limiting quantity in the reactor at the desired temperature, pressure and conditions of reaction.

In a method according to one embodiment of the invention, substrates 3 in the form of flat, thin discs are disposed on the treatment surface 18 of the substrate carrier 2 so that the substrates 3 overlay the treatment surface 18 and so that the surfaces of the substrates 3 to be treated face upwardly, toward top wall 16. Desirably, the exposed surfaces of the substrate 3 are coplanar or nearly coplanar with the surrounding portions of the treatment surface. For example, a substrate 3 in the form of a relatively thin wafer placed on a treatment surface 18 will have an exposed, upwardly facing surface elevated above the surrounding portions of the treatment surface 18 by only the thickness of the wafer 3. The treatment surface 18 of the substrate carrier 2 may include pockets or depressions having a depth approximately equal to the thickness of the wafer (not shown).

When the substrate carrier 2 and substrates 3 are at the desired temperature for the reaction, and the interior of the chamber 1 is at the desired pressure for the particular reaction to be accomplished, the reaction gas sources 6a-6d, carrier gas sources 7a-d and carrier gas sources 20a-d are actuated to supply gases to inlets 8a-8d. The reactant gas 4 and carrier gas 5 and 19 supplied to gas inlets 8a-8c and reactant gas 21 and carrier gas 5 and 19 supplied to gas inlet 8d respectively mix to form a combined gas stream 9a-9d issuing from each inlet 8a-8d. The gas streams 9a-9d issuing from the inlets flow downwardly into the chamber, in the axial direction parallel to axis 14, and impinge on the treatment surface and on the exposed surfaces of the substrates 3. The gas streams 9a-9d from different inlets 8a-8d impinge on different zones 10a-10d of the treatment surface 18. For example, stream 9a issuing from inlet 8a impinges predominantly on innermost zone 10a, whereas streams 9b, 9c and 9d impinge predominantly on zones 10b, 10c and 10d, respectively. Thus, although the streams 9a-9d merge with one another to form a substantially continuous, radially elongated stream or curtain of gas flowing towards the substrate carrier, the individual streams 9a-9d of from the various inlets 8a-8d pass to different zones 10a-10d of the treatment surface 18. Stated another way, the gas impinging on innermost zone 10d of the treatment surface 18 is composed principally of gas in stream 9d from inlet 8d, whereas the gas impinging on zone 10b is composed principally of gas in stream 9b from inlet 8b, and so on. As the substrate carrier 2 rotates at a predetermined rotation rate α, different portions of the carrier 2 at different circumferential positions around axis 14 are brought into alignment with the gas streams 9a-9d, so that exposure of the treatment surface 18 to the gas streams 9a-9d is the same at all circumferential positions.

To provide equal reaction rates on the various regions of the exposed substrate 3 surfaces, all regions 10a-10d of the treatment surface 18 should be provided such that substantially equal amounts of reactant gas 4 and and the reactant gas 21, respectively, react at the treatment surface per unit area of treatment surface per unit time. However, the zones 10a-10d supplied by the various gas outlets are of unequal area. For example, zone 10a, adjacent the periphery of the treatment surface, has a larger surface area than zone 10d, adjacent the axis. Accordingly, the reactant gas flow rates provided by sources 6a-6d are selected to provide different flow rates of reactant gas in the streams 9a-9d issuing from the various inlets 8a-8d. Unless otherwise indicated, the flow rates referred to in this discussion are molar flow rates. The molar flow rate represents the number of molecules of gas (or atoms in a monatomic gas) per unit time. Source 6a is thus arranged to supply reactant gas 4 at a relatively large flow rate to inlet 8a for stream 9a, whereas source 6c is set to supply reactant gas 4 at a relatively small flow rate to inlet 8c for stream 9c. Source 6b supplies the reactant gas 4 at intermediate flow rates. Stated another way, the reactant gas flow rate increases in direct relation to the distance between the central axis 14 of rotation for the substrate carrier 2 of the reactor 1 and the gas inlet 8a-8d to be supplied with reactant gas. In the example of FIG. 1A, the other reactant gas 21 is supplied through the central source 6d at a flow rate selected to ensure that it substantially equally mixes with the reactant gas 4 at the treatment surface. Carrier gas sources 7a-7d are set to supply the carrier gas 5 at different flow rates to the various inlets 8a-8d. The flow rates of the carrier gas are selected so that the velocities of the various streams 9a-9d will be substantially equal to one another. For inlets of the same configuration—which provide streams of equal cross-sectional area—the volumetric flow rate of the streams 9a-9d issuing from each inlet 8a-8d should be substantially equal.

As a first approximation, assuming that the gases are near ideal gases, the volumetric flow rate of the gas in each stream is directly proportional to the total molar flow rate in the stream, i.e., to the sum of the reactant gas molar flow rate and the carrier gas molar flow rate. Thus, to provide streams having substantially equal total molar flow rates and hence equal velocity, the carrier gas molar flow rate supplied by sources 7c and 19c to inlet 8c must be greater than the carrier gas molar flow rate supplied by sources 7a and 19a to inlet 8a. The greater carrier gas flow rate supplied to inlet 8c and incorporated in stream 9c compensates for the smaller reactant gas flow rate from reactant gas source 6c relative to that provided by reactant gas source 6a to inlet 8a.

Stated another way, the various streams have the same total volumetric flow rate but different concentrations of reactant gas. Stream 9a impinging on the largest zone 10a has the highest reactant gas flow rate, and the lowest carrier gas flow rate, whereas stream 9c impinging on the smaller zone 10c has the lowest reactant gas concentration, and hence the highest carrier gas flow rate.

This arrangement is indicated graphically by bars 13a-13c in FIG. 1. The overall length C of bar 13c represents the total molar flow rate or volumetric flow rate of stream 9c issuing from inlet 8c. The length of the darkened portion of this bar represents the reactant gas molar flow rate vc in the stream, whereas the white portion of the bar represents the carrier gas molar flow rate ic in the same stream 9c. Bars 13a and 13b similarly represent the composition and flow rate of streams 9a and 9b respectively. The overall lengths C of all bars 13 are equal, but bars 13a, 13b and 13c represent the progressively greater reactant gas molar flow rates vc, vb and va and progressively lower carrier gas molar flow rates ic, ib, ia in streams 9c, 9b and 9a. By supplying the various streams 9a-9c at different concentrations of reactant gas but at the same total stream flow rate/velocity, the system avoids stable laminar recirculation areas and other flow irregularities such as, in some instances, turbulence, which would be created by streams of different velocities, and yet supplies substantially equal molar flow rates of reactant gas per unit area to the various zones of the of the treatment surface. Bar 13d represents the carrier gas flow rate id and reactant gas 21 molar flow rate vd, which are, in this embodiment, advantageously selected to match total gas flow rate (vd +id) to substantially the same total value C as the other three total gas flow rates 13a-c.

Thus, the exposed surfaces of the wafer 3 at all portions of the treatment surface 18 receive substantially the same amount of reactant gas per unit time per unit area. The reaction thus proceeds at a substantially uniform rate over all of the exposed wafer surfaces 3. For example, where the reaction involves deposition of a layer such as epitaxial growth, the deposited layer grows at a substantially uniform rate on the various exposed surfaces.

Importantly, in addition to matching total gas flow rate as described above, it has been found that matching total gas density substantially decreases gas flow nonlinearity and reduces residual deposition byproducts, such as, for example gas-phase adduct formation, gas-phase particle formation, and sidewall deposits. One manner found for matching gas density is the use of two carrier gases of different weights at each gas inlet, as shown in FIG. 1A. By combining the two carrier gases of different molar weights at each inlet at different proportions relative to the reactant gas density of the reactant gases 4 and/or 21, the total gas density at each gas inlet 9a-9d can be readily matched.

Traditional systems usually employ only one carrier gas to push reactants through respective gas inlets. For GaN deposition processes, this has been N2 employed as a carrier gas for use to push the alkyl reactant such as TMG. Thus, when matching flow rates between the first reactant—an alkyl such as TMG, for example, and another reactant released closer to the central axis, such as ammonia, for example, the amount of N2 needed to match flow rates at all gas inlets may result in relatively higher gas densities for the alkyl reactants than the hydride reactants. This difference can be corrected by using a ratio of two different carrier gases with different molecular weights to simultaneously match gas flow rate and gas density.

Stated briefly, gas flow rate and gas density, in this case for an alkyl-hydride deposition process for GaN deposition, can be both matched via the following process: First the hydride mixture is set up to get good laminar flow in the chamber (and material properties at the growth surface) as described above. The flow rate/velocity (flow per unit area of hydride zone) and density (gm/mole per unit area of hydride zone) are computed for the gases at each inlet. Then, flow rate matching of the alkyl reactant and carrier gases at each alkyl gas inlet can be performed as described above, as with the hydrides, by computing the total flow needed for the alkyl area. Density can then advantageously be independently matched for alkyl reactant inlets by adding a second carrier gas of different molecular weight, in this case H2, to the existing carrier gas N2, and modifying the respective ratio of N2 to H2 at each of the alkyl reactant inlets. Usually the alkyl reactant, such as TMG, provides a metalorganic flow that is very small and thus will not significantly contribute to the density computations, however the alkyl contribution can become a significant portion of the overall gas density in some setups, and thus may require taking the contributions into account.

For example, it has been found that in a Veeco Turbodisc E300 GaNZilla reactor at subatmospheric pressures of approximately 200 torr, expressed in standard liters per minute (slm), at the outer alkyl inlets, setting the respective gases to approximately H2=100 slm, N2=17 slm, and TMGa=7.7e-4 moles/min at mole weight at 144 gms/mole=0.1 gms/min, with NH3=30 slm at the hydride inlet(s). Similarly, for an Veeco Enterprise 450LDM, at 50 torr growth, it has been found that at the outer inlets H2=108 slm and reactant TMGa=2.8e-3 moles/min=0.4 gms/min when reactant AsH3=2 slm max at the inner inlet(s). The determination of the proper ratio for the two or more carrier gases will frequently rely on individual characteristics of the particular deposition setup, including the deposition chamber pressure, geometry of the reaction chamber, and so on. However, to a first approximation the proper levels of each carrier gas can be determined based on knowledge of their molecular weights, knowledge of the reactants, and ideal gas law assumptions.

As used herein, the first reactant gas is termed R1, the second reactant gas is termed R2, the first carrier gas is termed C1, and the second carrier gas is termed C2. Each gas has a molecular weight mw(R1), mw(R2), mw(C1) and mw(C2) respectively. In a system with four gas flow stream outlets, $8a$, $8b$, $8c$ and $8d$, each gas flow stream outlet $8a$, $8b$, $8c$ and $8d$ has an outlet area (which may vary from outlet to outlet) of areaa, areab, areac, and aread. Each stream also has a total gas flows Va, Vb, Vc and Vd where each total gas flow is equal to the sums of the individual gas flows (flows $6a$-$d$, $7a$-$d$ and $20a$-$d$ respectively for each stream a-d) divided by the area of each respective gas outlet. Each of the four gas flow stream locations also as a total gas density da, db, dc and dd equal to the sums of the individual densities of each of the reactant and carrier gases supplied at each location $8a$, $8b$, $8c$ and $8d$ multiplied by the respective molecular weights of the reactant and carrier gases. Thus, for example, assuming an approximately ideal gas, based on the configuration of the system of FIG. 1:

$$V_a \text{ (cm/min)} = (\text{flow}_{6a} \text{ (cm}^3\text{/min)} + \text{flow}_{7a} \text{ (cm}^3\text{/min)} + \text{flow}_{20a} \text{ (cm}^3\text{min)})/\text{area}_a \text{ (cm)} \quad \text{(Eq. 1)}$$

$$V_b = (\text{flow}_{6b} + \text{flow}_{7b} + \text{flow}_{20b})/\text{area}_b \quad \text{(Eq. 2)}$$

$$V_c = (\text{flow}_{6c} + \text{flow}_{7c} + \text{flow}_{20c})/\text{area}_c \quad \text{(Eq. 3)}$$

$$V_d = (\text{flow}_{6d} + \text{flow}_{7d} + \text{flow}_{20d})/\text{area}_d \quad \text{(Eq. 4)}$$

$$V = V_a = V_b = V_c = V_d = \text{Velocity (flow rate) of each hydride section} \quad \text{(Eq. 5)}$$

(Total Flow of Hydride Gases Through Each Cross-sectional Area of the Hydride Section)

The relative concentration (at molarity) of each gas, X, using simplified terminology where R1, R2 and C1 and C2 stand for the two reactant and two carrier gases from sources $6a$-$d$, $7a$-$d$, $20a$-$d$ and other sources, can be approximated as the velocity as:

$$X(R1) = \frac{V(R1)}{V(R1) + V(C1) + V(C2)} \quad \text{(Eq. 6)}$$

$$= \frac{V(R1)}{V}$$

Similarly, for total gas density at each gas flow stream location:

$$d_a = X_a(R_1)mw(R_1) + X_a(C_1)mw(C_1) + X_a(C_2)mw(C_2) \quad \text{(Eq. 7)}$$

$$d_b = X_b(R_1)mw(R_1) + X_b(C_1)mw(C_1) + X_b(C_2)mw(C_2) \quad \text{(Eq. 8)}$$

$$d_c = X_c(R_1)mw(R_1) + X_c(C_1)mw(C_1) + X_c(C_2)mw(C_2) \quad \text{(Eq. 9)}$$

$$d_d = X_d(R_2)mw(R_2) + X_d(C_1)mw(C_1) + X_d(C_2)mw(C_2) \quad \text{(Eq. 10)}$$

where, $$d = d_a = d_b = d_c = d_d = \text{Total gas density for each cross-sectional area of the hydride section} \quad \text{(Eq. 11)}$$

The reactant gas flow Va is predetermined to provide substantially equal deposition per unit area in the treatment region below gas flow stream a, and the total gas flow v is constant as are the molecular weights mw(R1), mw(C1), and mw(C2). Thus, from equations 1, 5, 6 and 7 above, one finds that by basic algebraic manipulation:

$$V_a(C_1) = V - V_a(R_1) - V_a(C_2) \quad \text{(Eq. 11)}$$

$$dv = V_a(R_1)mw_a(R_1) + V_a(C_1)mw_a(C_1) + V_a(C_2)mw_a(C_2) \quad \text{(Eq. 12)}$$

$$V_a(C_2) = \frac{V_a(R_1)mw(R_1) + vmw(C_1) - V_a(R_1)mw(C_1)}{mw(C_1) + mw(c_2)} \quad \text{(Eq. 13)}$$

and where $V_a(C1)$ can be calculated via re-application of Equation 11, above. In this manner, for each carrier gas at each gas flow stream, the appropriate gas flow rate to assure equal total gas flow rate/velocity and equal total gas density can be determined.

Moreover, the system can be varied to deliver unequal amounts of reactant gas per unit surface area per unit time in situations where that is needed. This may be needed when, for example, (a) gas phase depletion occurs whereby as reactants are depositing on the substrate, the relative concentration is reduced, or (b) when re-evaporation of surface species at the disk back into the gas phase occurs, which may cause re-deposit further out on the substrate. For example, the gas flow pattern within the reactor may include some flow in the radially outward direction, away from axis 14 at or near the treatment surface. Such flow may tend to carry some unreacted reactant gas from the innermost zone 10$d$ toward the outermost zone 10$a$. To compensate for this effect, the gas sources can be adjusted to deliver slightly more reactant gas to the innermost zone, as by increasing the reactant gas concentration in innermost stream 9$d$ above that which would be required to achieve exactly equal reactant gas flow per unit time. In this case, the reactant gas flow and reactant gas concentration will not be exactly proportional to radial distance from axis 14. However, the system still uses multiple gas streams of differing concentration but the same flow rate to provide a downwardly or axially flowing gas curtain having substantially uniform flow rate but unequal reactant gas concentration at different radial locations. Unequal amounts of reactants are also necessary when, for example, a central gas inlet releases a hydride reactant while outer inlets release an alkyl, and so on.

Moreover, the system can be adapted to provide density matched and flow rate/velocity matched carrier gases without the inclusion of a reactant gas. In some circumstances, density matched and flow rate/velocity matched carrier gases are included to create a carrier gas "shroud" surrounding independently controlled alkyl and hydride ports. Similarly, if a single reactant port is injecting a reactant gas of high molecular weight, that port can be surrounded by density matched and flow rate/velocity matched ports as described above that are controlled independently of the single reactant port or that are matched to the single reactant port. Advanageously, the system described herein can be used in situations where more than four gases are used, i.e. when there are more than two carrier gases and/or when there are more than two reactant gases. In some systems, for example, eight or nine gases are provided to the reaction chamber, and through selection of carrier gases, all gases and gas inlets can be density matched and flow rate/velocity matched per the procedure described herein.

In another variant, the reactant gas concentration in the gas stream from the outermost inlet 8a may be 100%, so that the downwardly-flowing gas impinging on the outermost zone consists entirely of the reactant gas, with no carrier gas. In this instance, carrier gas source 7a associated with inlet 8a may be omitted. Also, the principles discussed above can be applied with more or fewer gas inlets directed onto more or fewer zones.

Figure 2:
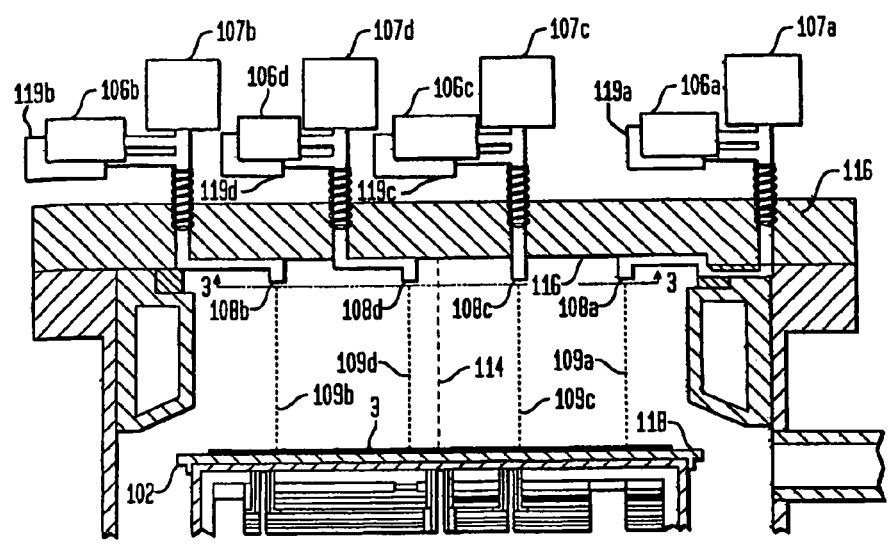
FIG. 2 is a fragmentary sectional elevational view depicting a reactor according to another embodiment of the invention.
Figure 3:
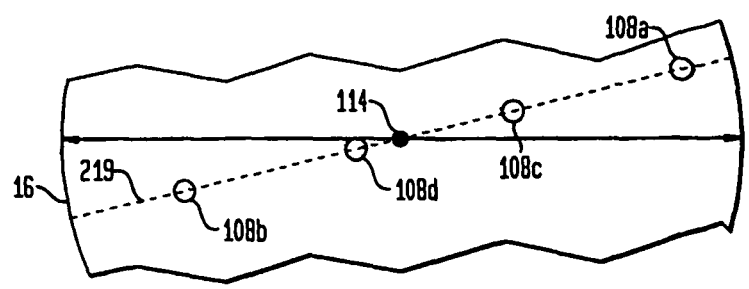
FIG. 3 is a fragmentary view along line 3-3 in FIG. 2.
Figure 4:
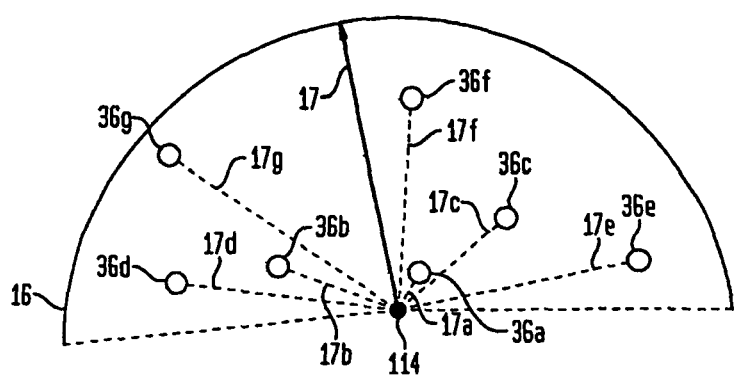
FIG. 4 is a fragmentary bottom plan view of a plate used in a reactor according to a further embodiment of the invention.

In apparatus according to a further embodiment of the invention, seen in FIGS. 2 and 3, the gas stream inlets are not disposed in a radial plane on one side of the axis of rotation as discussed above with reference to FIG. 1. Instead, in the embodiment of FIGS. 2 and 3, the outermost gas inlet 108a is disposed on one side of the axis of rotation 114 of substrate carrier 102, and at a large radial distance from the axis, whereas the next gas inlet 108b lies on the opposite side of axis 114 but at a lesser radial distance from the axis. Inlets 108c and 108d, at lesser radial distances from axis 114, also lie on opposite sides of the axis along a common diameter 219 (FIG. 3). Here again, the different gas streams 109a-109d impinge on different zones of treatment surface 118 having different areas. The carrier gases flow from carrier gas sources 107a-107d and 119a-119d respectively, and the one or more reactant gas flows from reactant gas sources 106a-106d, where the gas flow rate for these gases are selected in the same manner as described above, so as to provide gas streams 109a-109d with different reactant gas concentrations and flow rates, but with similar total gas velocities and substantially similar gas densities. In a further variant, the gas inlets may be provided as two complete sets, one on each side of the central axis, each such set including a full complement of gas inlets adapted to direct gas onto all of the zones of the treatment surface. More than two sets of gas inlets may be provided as, for example, four sets disposed on two diameters. In a further variant (FIG. 4) the various gas inlets 36a-36g may be distributed along different radii 17a-17g, and at different radial distances from the central axis 114.

In the apparatus discussed above, each gas stream is formed by mixing carrier gas and reactant gas prior to introducing the mixed gases into the reaction chamber. However, this is not essential. In the apparatus of FIGS. 5A and 5B, the innermost gas inlet 208d includes two separate ports opening through reactor top wall 216: a reactant gas port 230d and a carrier gas port 232d. The reactant gas port 230d is connected to a reactant gas source 206d, whereas the carrier gas port 232d is connected to both a carrier gas source 207d and a second carrier gas source 219a, where as described above, preferably the first and second carrier gases have different molecular weights Ports 230d and 232d are disposed adjacent to one another, so that the carrier gas introduced through port 232d merges with the reactant gas introduced through port 230d just after the gases enter the interior of reaction chamber 201, and form a combined gas stream passing downwardly onto the associated zone of treatment surface 218. Each of the other inlets 208a-208c is constituted by a similar pair of ports, and operates in the same manner.

The apparatus of FIGS. 5A and 5B also includes a porous plate 215 mounted within reaction chamber 210, between top wall 216 and the treatment surface. As discussed in greater detail in U.S. Pat. No. 6,197,121, the disclosure of which is incorporated by reference here, such a porous plate can include, for example, a wire mesh screen supported by a set of coolant conduits. The porous plate has an upstream or inlet side facing toward the top wall 216, and has a downstream side facing toward substrate carrier 202 (toward the bottom of the drawing in FIG. 5A). The porous plate 215 is spaced from the top wall. A set of barrier walls 250 extend between the top wall 216 and the porous plate 215 in the vicinity of inlets 208a-208d. The barrier walls 250 subdivide the space upstream of the porous plate into spaces 254a-254d. Each gas inlet 208a-208d opens into one such space. Additional walls 256 separate spaces 254a-254d from other spaces 258 (FIG. 5B) disposed upstream of the porous plate.

In operation, the carrier gases and reactant gas provided through each inlet mix within the space 254 associated with that inlet, and pass through a region of the porous plate aligned with such space. For example, the combined gases provided by inlet 208d, including reactant gas from port 230d and carrier gases from port 232d, passes downstream through a region of the porous plate 215, and passes from the downstream side of the injection plate to the treatment surface as a stream 209d, so that this stream impinges principally on the innermost region 210d of the treatment surface 218. In the same manner, the gases from inlets 208c, 208b and 208d mix in spaces 254c, 254b and 254a, respectively, to form streams 209c, 209b and 209a, which impinge on other regions of the treatment surface. Although the individual streams are depicted separately in FIG. 5A for clarity of illustration, in actuality the streams spread radially and merge with one another enroute from the porous plate 215 to the treatment surface. Here again, the flow rates of the carrier gas and reactant gas supplied by each of the gas sources are selected so that the total flow rate in each stream 209, and hence the flow rate of each stream, is substantially equal, and the ratio of the two carrier gases 219 and 207 are varied to equalize the gas density in each stream 209, but the concentration of reactant gas in the various streams is unequal. In this arrangement as well, additional sets of inlets 208' for the carrier gas and reactant gas may be provided at other locations spaced circumferentially around central axis 214. Each such set is arranged in the same manner as inlets 208a-208d. Also, other gases used in the growth process can be introduced through additional inlets (not shown) connected to additional spaces 258. Such other gases can be introduced at the same time as the carrier gas and reactant gas, or at other times, during other stages of the process.

A similar porous plate may be used with inlets such as those discussed above with reference to FIGS. 1A and 2.

Figure 6:
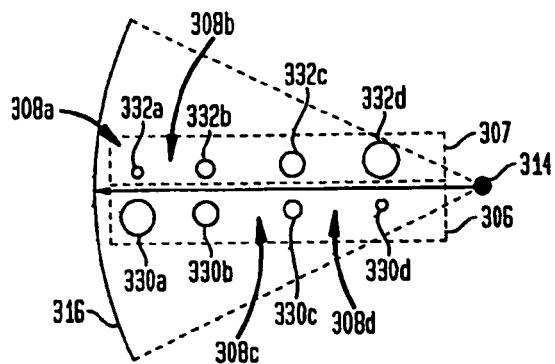
FIGS. 6, 7 and 8 are view similar to FIG. 4 but depicting portions of plates used in reactors according to additional embodiments of the invention.

In apparatus according to a further embodiment (FIG. 6), the ports constituting the inlets act to control the amounts of gases in each gas steam. In this embodiment, the outermost gas inlet 308a includes a reactant gas port 330a and a carrier gas port 332a, whereas each of the other gas inlets 308b, 308c and 308d includes a similar pair of ports. Here again, the ports constituting each gas inlet are disposed adjacent to one another. The ports are arranged along a common radial line 317. All of the reactant gas ports 330a, 330b, 330c and 330d are connected to a common conduit 306 which in turn is connected to a supply of reactant gas, so that all of the reactin gas ports are supplied with the reactant gas at substantially the same pressure. Likewise, all of the carrier gas ports 332a, 332b, 332c and 332d are connected to a common conduit 307, which in turn is connected to a supply of the carrier gas, so that all of the carrier gas ports are supplied with the carrier gas at substantially the same pressure. The sizes of the ports, and hence the flow resistances of the ports, differ. Reactant gas port 330a of the outermost gas inlet 308a is relatively large, and has relatively low flow resistance, whereas carrier gas port 332a of the outermost gas inlet is relatively small, and hence has high flow resistance. Accordingly, the gas stream issuing from these ports and hence from gas inlet 308a will incorporate a large proportion of reactant gas and a small proportion of carrier gas. Conversely, reactant gas port 330d of the innermost gas inlet 308d is relatively small, and has high flow resistance, whereas the carrier gas port 332d of the same inlet is relatively large, and has high flow resistance. The gas stream issuing from inlet 308d will have a relatively large proportion of carrier gas. As will be appreciated with reference to FIG. 6, the sizes of the reactant gas ports 330 increase progressively in the radially outward direction, away from axis 314, i.e., in the direction from the smallest zone of the treatment surface to the largest zone, so that the flow resistance of the reactant gas ports decreases progressively in this direction. Conversely, the flow resistance of the carrier gas ports increases progressively in the same direction. The apparatus thus will provide gas streams having substantially the same total flow rate (carrier gas plus reactant gas) but differing concentrations of reactant gas, impinging on the differing zones of the treatment surface. Plural sets of ports as described above can be provided along numerous radial lines, so as to provide a plurality of such streams around the circumference of the chamber.

Figure 7:
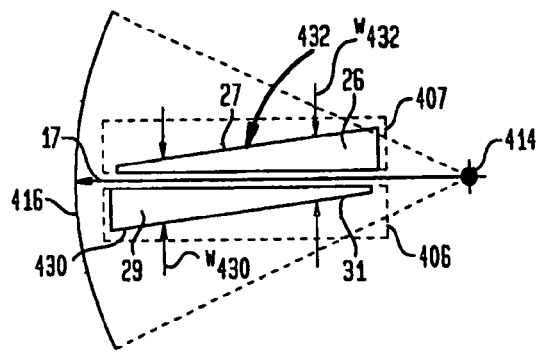

In a further variant (FIG. 7) the separate ports and inlets of are replaced by a carrier gas passage 432 and reactant gas passage 430 extending through top plate 416. The downstream ends of these passages (the ends of the passages opening into the reaction chamber) are visible in FIG. 7. The passages are disposed side-by-side. Carrier gas passage 432 is connected to carrier gas conduit 407, whereas reactant gas passage 430 is connected to a reactant gas conduit 406. Conduits 407 and 406 are connected to supplies of carrier gas and reactant gas, respectively. The carrier gas passage 432 has a width w432 which decreases progressively in the radially outward direction away from axis 414. Thus, the resistance of the carrier gas passage to flow of the carrier gas in the downstream direction of the passage (the direction out of the plane of the drawing in FIG. 7) increases progressively in the radially outward direction. The reactant gas passage has a width w430 which increases progressively in the radially outward direction, so that the resistance of the reactant gas passage to downstream flow of reactant gas decreases progressively in the radially outward direction. In operation, a relatively large amount of reactant gas passes through the radially outer portion of the reactant gas passage 430 whereas a relatively small amount of carrier gas passes through the radially outer portion of carrier gas passage 432. Conversely, a small amount of reactant gas and a large amount of carrier gas pass through the radially inner portions of the passages. The carrier and reactant gases merge to form a gas stream passing downstream (in the direction out of the plane of the drawing in FIG. 7), such gas stream having a substantially constant total flow rate per unit of cross-sectional area (of the respective gas inlets), or per unit radial distance and substantially constant flow rate/velocity at all radial locations but having progressively increasing reactant gas concentration in the radially outward direction.

Figure 8:
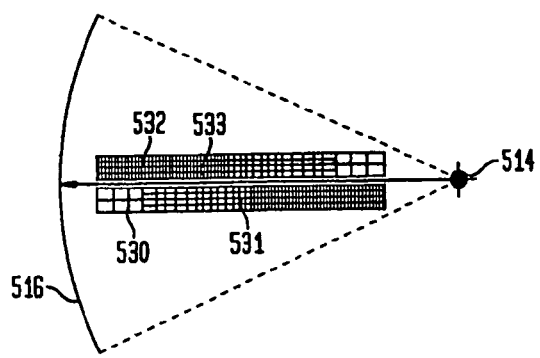

A reactor according to a further embodiment of the invention, shown in FIG. 8, has a reactant gas passage 530 and carrier gas passage 532 similar to the passages discussed above with reference to FIG. 7. In the reactor of FIG. 8, however, the passages have constant width over their radial extent. Reactant gas passage 530 is filled with a mesh or other porous structure 531 having progressively increasing porosity in the radially outward direction, away from axis 514. Accordingly, the resistance of passage 530 to downstream flow of reactant gas decreases in the radially outward direction. The carrier gas passage 532 is filled with a porous structure 533 having progressively decreasing porosity, and hence progressively increasing flow resistance, in the radially outward direction. The net effect is the same as discussed with reference to FIG. 7. Other features of the passageways can be varied to achieve similar variations in flow resistance along the radial extent of the passageways. For example, the passageways can include baffles or partial obstructions disposed at various radial locations. In yet another variant, each passage can have different lengths, in the downstream direction of the passage, at its inner and outer edges. For example, where a passage extends through a plate, the thickness of the plate can vary in the radial direction so as to vary the length of the passage, and hence the flow resistance of the passage, in the radial direction.

FIGS. 9a and 9b provide a side view of a reactor according to one embodiment of the present invention including a diagrammatic representation of reactant gas density through vertical gas flow rate per unit cross-sectional area of the gas inlets, before density matching in FIG. 9a, and after density matching in FIG. 9b. The internal reactor chamber 900 includes a set of injection ports 910 and a model representation of total gas flow 920, wherein regions of linear flow are shown in a flow pattern 940, and vortices of nonlinear gas flow representing undesired stable laminar recirculation areas are shown in open regions 930 of the total gas flow model 920. While the nonlinear gas flow vortices 930 are substantial when gas flow is flow rate per unit area (e.g. linear velocity) matched but not density matched, as in FIG. 9a, they disappear when density matching is performed. In FIG. 9b, where both flow rate matching and density matching have been modeled, no substantial nonlinear gas flow vortices appear.

Figure 10B:
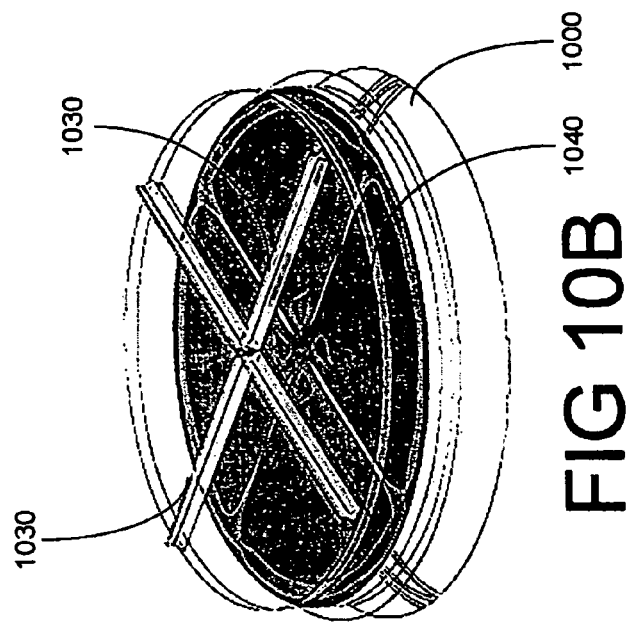
FIGS. 10a and 10b provide an exploded top view of a gas distribution head and wafer carrier of one embodiment of the present invention including a fluid flow representation of reactant gas density through horizontal gas flow rate/velocity, before density matching in FIG. 10a and after density matching in FIG. 10b.
Figure 10A:
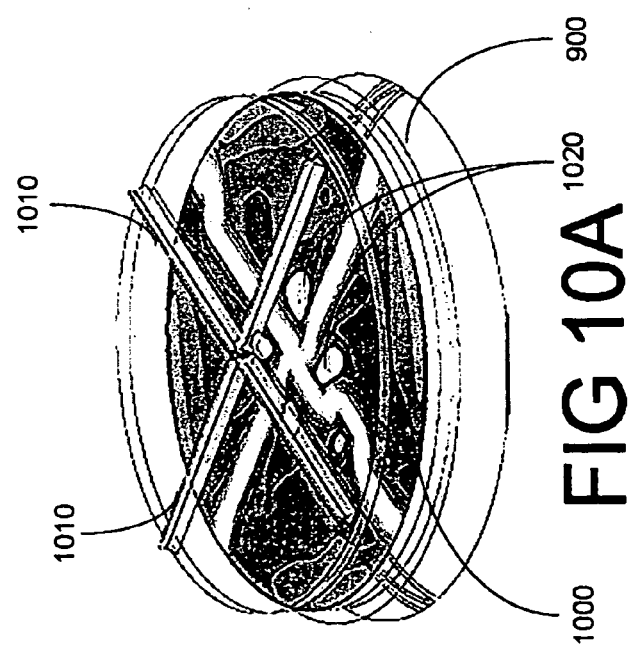

FIGS. 10a and 10b provide an exploded top view of a gas distribution head and wafer carrier of one embodiment of the present invention including a diagrammatic representation of reactant gas density through horizontal gas flow rate per unit area of the gas inlet/velocity, before density matching in FIG. 10a and after density matching in FIG. 10b. Alternatively, horizontal gas flow rate can be measured per unit area of the reactor. One embodiment may, for example, have a set of gas inlets with a density of approximately 1.55 inlets/cm2, as described in U.S. patent application Ser. No. 11/192,483, entitled "MULTI-GAS DISTRIBUTION INJECTOR FOR CHEMICAL VAPOR DEPOSITION REACTORS", filed Jul. 29, 2005, assigned to the assignee of the present application, and hereby incorporated by reference in its entirety. The cross-sectional area of an incoming gas inlet varies depending on the type of inlet used. In one embodiment, the alkyl and hydride tubes in the injectors have diameters of approximately 0.047" (0.18 mm) and 0.089" (0.35 mm) respectively, or areas of 1.7e-3 sq. inch and 6.2e-3 sq. inch, respectively. The spacing between the injectors is around 0.35" (1.3 mm). Other injectors that may be used have injectors with internal diameters of approximately 0.04" (area=1.2e-3 sq in), equally spaced at about 0.11", or injectors that are tubes ¼"-⅜" in diameter, feeding cavities of varying sizes (0.5 to 0.75" wide, 0.125 to 0.25" deep, and 0.5 to 3" long. As such, the cross sectional area at the interface between the gas inlet and the reaction chamber although that area may vary depending on implementation and application. The cross sectional areas referred to herein are typically the inner cross sectional areas of the inlet where the gas streams flow therein.

In FIG. 10a, a reaction chamber 900 is shown with a set of injection ports 1010 above it where flow rate matched (but not density matched) gases for deposition are injected. A deposition surface flow model 1000 is provided, where regions of undesired stable laminar recirculation, and thus uneven deposition, are shown as open regions 1020. In FIG. 10b, when density matching is performed in addition to flow rate (per unit cross-sectional area of the incoming gas injection ports) matching at injection ports 1030, a density-matched deposition surface flow model 1040 shows no vortices, undesired stable linear recirculation, turbulence or open regions, thus showing the increase in evenness of deposition achieved through the combination of flow rate/velocity matching and density matching. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

INDUSTRIAL APPLICABILITY

The present invention is applicable to the electronics manufacturing industry and where it is desired to manufacture electronics components in large number through the epitaxial growth of materials thereon. The present invention is applicable to, for example, vertical disk reactors for the epitaxial growth of materials on silicon wafers for electronics components.

The invention claimed is:

1. A method of treating substrates comprising:
rotating a substrate support about an axis while supporting one or more substrates on the support so that one or more surfaces of the substrates to be treated lie substantially perpendicular to the axis of rotation in a gas treatment chamber;
introducing a plurality of gas streams each with a known cross-sectional stream area into the chamber toward the substrate via a plurality of gas inlets, each said stream containing a reactant gas and at least one carrier gas, at least two different ones of the streams containing different carrier gases with different molecular weights, the plurality of gas streams having different concentrations of the reactant gas at different radial distances from the axis, the flow rates per unit cross-sectional area of the carrier gases in each of said streams being selected so that the total density of the gases constituting each stream is the same as the total density of the gases constituting the other streams and so that the total flow rate of the gases per unit cross-sectional area constituting each stream is the same as the total flow rate per unit cross-sectional area of the gases constituting each other stream.

2. The method as claimed in claim 1 wherein at least one of the streams includes at least two different carrier gases.

3. The method as claimed in claim 1 wherein the step of introducing the plurality of gas streams includes introducing the streams through a plurality of nozzles, each nozzle having a known cross-sectional area.

4. The method as claimed in claim 1 wherein the step of introducing the plurality of gas streams includes introducing the streams through a gas slit channel with a known cross-sectional slit area.

5. A method of treating substrates, comprising:
rotating a substrate support about an axis while supporting one or more substrates on the support so that one or more surfaces of the substrates to be treated lie substantially perpendicular to the axis in a gas treatment chamber;
introducing a plurality of gases into the chamber via a plurality of gas inputs each having a cross-sectional input area;
introducing at least a reactant gas and a first carrier gas, having a first carrier molecular weight into the chamber via a first one of the gas inputs in a first gas stream, the first gas stream having a first total gas flow rate per unit cross-sectional input area and a first total gas density;
introducing at least the reactant gas and a second carrier gas, having a second carrier molecular weight, said first carrier molecular weight different from said second carrier molecular weight, into the chamber via a second one of the gas inputs in a second gas stream, the second gas stream having a second total gas flow rate per unit cross-sectional input area and a second total gas density, said second gas stream having a different radial distance from the axis than said first gas stream, and a concentration of the reactant gas in said second gas stream being different than a concentration of the reactant gas in said first gas stream;
maintaining as substantially equal the first total gas flow rate and the second total gas flow rate; and,
maintaining as substantially equal the first total gas density and the second total gas density.

6. The method of claim 5, wherein the steps of maintaining substantially equal first and second total gas flow rates and first and second total gas densities further comprises:
regulating the flow of the first carrier gas into the first gas input via a first adjustable mass flow regulator; and,
regulating the flow of the reactant gas into the first gas input via a second adjustable mass flow regulator.

7. The method of claim 5, wherein the steps of maintaining substantially equal first and second total gas flow rates and first and second total gas densities further comprises regulating the cross-sectional input area of the first one of the gas inputs.

8. The method of claim 5, further including:
introducing the reactant gas and the first and second carrier gases to the reaction chamber via a gas slit channel substantially parallel to the substrates.

9. The method of claim 5, further including:
introducing the reactant gas and the first and second carrier gases to the reaction chamber by way of nozzles on the surface a gas showerhead substantially parallel to the substrates, the nozzles substantially directed towards the substrates.

10. The method of claim 9, further including:
providing the first carrier gas along with the reactant gas and the second carrier gas in the second gas stream.

11. The method of claim 9, further including:
introducing at least the reactant gas into the chamber via a third gas input in a third gas stream, the third gas stream having a third total gas flow rate per unit cross-sectional input area and a third total gas density, a concentration of the reactant gas in said third gas stream being different than the concentrations of the reactant gas in said first and second gas streams;
maintaining as substantially equal the first total gas flow rate, the second total gas flow rate, and the third gas flow rate;
maintaining as substantially equal the first total gas density, the second total gas density, and the third total gas density.

12. The method of claim 11, further comprising providing at least one of the first and second carrier gases along with the reactant gas in the third gas stream.

13. The method of claim 5, further comprising providing the second carrier gas along with the reactant gas and the first carrier gas in the first gas stream.

14. The method of claim 5, further comprising:
providing the second carrier gas along with the reactant gas and the first carrier gas in the first gas stream; and
providing the first carrier gas along with the reactant gas and the second carrier gas in the second gas stream;
wherein the step of maintaining equal first and second total gas flow rate and the step of maintaining equal first and second total gas density comprises regulating the flow of the reactant gas, the first carrier gas, and the second carrier gas in each of the first and second gas streams.

15. The method of claim 5, further comprising introducing at least a second reactant gas into the chamber via a third one of the gas inputs in a third gas stream, the third gas stream having a third total gas flow rate per unit cross-sectional input area and a third total gas density.

16. The method of claim 15, further comprising providing at least one of the first and second carrier gases along with the second reactant gas in the third gas stream.

17. A method for maintaining laminar flow in a chemical vapor deposition system employing a plurality of gases through a plurality of gas inlets with an inlet cross-sectional area, each with respective total gas flow rate per unit area and respective total gas density, into a sealed atmospheric environment containing a substrate support supporting one or more substrates, comprising:
directing a first subset of the plurality of gases through a first one of the gas inlets, the first subset of gases containing a reactant gas;
directing a second subset of the plurality of gases through a second one of the gas inlets, the second gas inlet spaced from the first gas inlet in a radial direction of the substrate support, at least one of the gases in the second subset not being in the first subset, the second subset of gases containing the reactant gas, a concentration of the reactant gas in the second subset of gases being different than a concentration of the reactant gas in the first subset of gases;
maintaining substantial equality between the total gas flow rate of the first subset of gases at the first gas inlet per unit area and the total gas flow rate of the second subset of gases at the second gas inlet per unit area; and,
maintaining substantial equality between the total gas density for the first subset of gases passing through the first gas inlet and the total gas density for the second subset of gases passing through the second gas inlet.

18. The method of claim 17, wherein the first subset of the plurality of gases includes a first carrier gas, and wherein the second subset of the plurality of gases includes a second carrier gas, the first carrier gas being different from the second carrier gas.

19. The method of claim 17, wherein the maintaining substantial equality between the total gas flow rate step is performed by way of a plurality of gas flow regulation devices associated with each of the gases in the plurality of gases.

20. The method of claim 19, wherein the gas flow regulation devices are mass flow regulators.

21. The method of claim 17, wherein the first subset of the plurality of gases includes at least one carrier gas and at least one alkyl gas, and wherein the second subset of the plurality of gases includes at least one carrier gas and at least one hydride gas.

22. The method of claim 17, further comprising:
adjusting the gas flow rate for at least one of the gases in the first subset of the plurality of gases and at least one of the gases in the second subset of the plurality of the gases to maintain the substantial equality between the total gas flow rate; and,
adjusting the selection of gases included in the first subset of the plurality of gases to maintain substantial equality between the total gas density for the first subset of gases passing through the first gas inlet and the total gas density for the second subset of gases passing through the second gas inlet.

* * * * *